(12) United States Patent
Chien et al.

(10) Patent No.: US 7,981,742 B2
(45) Date of Patent: Jul. 19, 2011

(54) SEMICONDUCTOR DEVICE, DATA ELEMENT THEREOF AND METHOD OF FABRICATING THE SAME

(75) Inventors: Wei-Chih Chien, Taipei County (TW); Kuo-Pin Chang, Miaoli County (TW); Erh-Kun Lai, Taichung County (TW); Kuang-Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 321 days.

(21) Appl. No.: 12/166,430

(22) Filed: Jul. 2, 2008

(65) Prior Publication Data

US 2010/0001330 A1    Jan. 7, 2010

(51) Int. Cl.
*H01L 21/8248* (2006.01)

(52) U.S. Cl. ........ 438/241; 438/237; 438/396; 257/324; 257/E21.334; 257/E29.308

(58) Field of Classification Search .................. 257/324, 257/E21.334, E29.308; 438/237, 240, 241, 438/396, 397
See application file for complete search history.

(56) References Cited

U.S. PATENT DOCUMENTS

| | | | |
|---|---|---|---|
| 7,033,884 B2 * | 4/2006 | Basceri et al. | 438/240 |
| 7,271,055 B2 * | 9/2007 | Lee et al. | 438/240 |
| 2004/0245557 A1 | 12/2004 | Seo et al. | |
| 2007/0114587 A1 | 5/2007 | Seo et al. | |
| 2007/0201276 A1 * | 8/2007 | Ho et al. | 365/185.18 |
| 2008/0157184 A1 * | 7/2008 | Lai et al. | 257/324 |
| 2008/0237798 A1 | 10/2008 | Lee et al. | |
| 2008/0318378 A1 * | 12/2008 | Wu et al. | 438/253 |
| 2009/0075466 A1 * | 3/2009 | Ho et al. | 438/591 |
| 2009/0147589 A1 * | 6/2009 | Kathawala et al. | 365/185.33 |
| 2010/0105165 A1 * | 4/2010 | Ho et al. | 438/104 |
| 2010/0155817 A1 * | 6/2010 | Cheng et al. | 257/324 |

FOREIGN PATENT DOCUMENTS

| | | |
|---|---|---|
| CN | 1574363 | 2/2005 |
| CN | 101079395 | 11/2007 |
| CN | 101174672 | 5/2008 |

OTHER PUBLICATIONS

English language translation of abstract of CN 1574363 (published Feb. 2, 2005).
English language translation of abstract of CN 101174672 (published May 7, 2008).
Chinese language office action dated Apr. 1, 2011.
English language translation of abstract of CN 101079395 (published Nov. 28, 2007).

* cited by examiner

*Primary Examiner* — Fernando L Toledo
(74) *Attorney, Agent, or Firm* — Thomas|Kayden (57) ABSTRACT

A method of fabricating a semiconductor device is provided. The method comprises: (a) providing a first and a second conductor; (b) providing a conductive layer; (c) forming a part of the conductive layer into a data storage layer by a plasma oxidation process, wherein the data storage layer is positioned between the first and the second conductor.

25 Claims, 6 Drawing Sheets

SEMICONDUCTOR DEVICE, DATA ELEMENT THEREOF AND METHOD OF FABRICATING THE SAME

BACKGROUND OF THE INVENTION

1. Field of the Invention

The invention relates in general to a semiconductor device, a data element and a method of fabricating the same, and more particularly to a programmable read-only memory device and a method of fabricating and operating the same.

2. Description of the Related Art

Semiconductor nonvolatile memories may be divided into two categories: (1) those in which data is permanently written during the manufacturing process and whose contents cannot be subsequently changed, called "mask ROMs" or "factory programmed ROMs"; (2) those in which data may be supplied after the finished memory device leaves the factory. This latter category is called "field programmable memories" because their contents may be written, by the user, when the semiconductor memory chip is deployed to its final application, "in the field".

Field programmable memories are further subdivided into "write once" memories and "write/erase/rewrite" memories. Those written once are referred to as "PROM" (programmable read-only memories) or "OTP ROM" (one time programmable read only memories). And those memories that provide write/erase/rewrite capabilities have been referred to as "UVEPROM" (ultraviolet erasable programmable read only memories) or "EEPROM" (electrically erasable programmable read only memories) or "Flash EEPROM" (fast and flexible EEPROMs). In contrast, the contents of mask ROMs are permanently stored during manufacture, therefore mask ROMs are not erasable and are effectively "write only once, at the factory" memories.

Field programmable memories are much more flexible than mask ROMs, since they allow system product makers to inventory a single general part-type for many applications, and to personalize (program the memory contents of) this one part-type in numerous different ways, much later in the system product flow. This flexibility lets system manufacturers more easily adapt to fluctuations in demand among different system products, and to update or revise system products without the expense of scrapping (discarding) existing inventories of pre-programmed mask ROMs. But this flexibility has a cost: field programmable memories generally achieve lower densities (fewer bits per chip) and higher cost (larger price per bit) than mask ROMs.

A well-known "OTP ROM" is produced by Matrix Semiconductor Inc. One layer of a layer stack constituting the OTP ROM is made of silicon dioxide. A silicon coating is oxidized to the silicon dioxide by thermal oxidation process. However, most thermal oxidation is performed in furnaces, at temperatures between 800 and 1200° C. The memory device would be deteriorated or damaged under such high temperature. Besides that, the finished OTP ROM must be programmed by applying a high-voltage pulse for a relatively long time, such as applying at least 10 Volt for 2 microseconds. The memory can be programmed just once after manufacturing by "blowing" the fuses (using a PROM blower), which is an irreversible process.

There is a need, therefore, for a programmable read-only memory device being capable of readily fabricated and reliably programmed.

SUMMARY OF THE INVENTION

The invention is directed to a semiconductor device, a data element thereof and a method of fabricating the same, in which a data storage layer is formed by a plasma oxidation layer and is capable of programming by low voltage and at high speed.

According to a first aspect of the present invention, a method of fabricating a semiconductor device is provided. The method comprises: (a) providing a first and a second conductor; (b) providing a conductive layer; (b) forming a part of the conductive layer into a data storage layer by a plasma oxidation process. The data storage layer is positioned between the first and the second conductor.

According to a second aspect of the present invention, a method of fabricating a data element is provided. The method comprises: (a) providing a conductive layer; and (b) oxidizing a part of the conductive layer into a data storage layer by a plasma process.

According to a third aspect of the present invention, a semiconductor device is provided. The semiconductor device comprises a first and a second conductor, and a data storage layer. The data storage layer, formed by a plasma oxidation process, is positioned between the first and the second conductors.

The invention will become apparent from the following detailed description of the preferred but non-limiting embodiments. The following description is made with reference to the accompanying drawings.

DETAILED DESCRIPTION OF THE INVENTION

The invention is directed to a method of fabricating a semiconductor device and a data element, in which a data storage layer is formed by a plasma oxidation process, and a structure of a semiconductor device. "Data" of the data storage layer means all kinds of digital data, including general data and every data relevant to command, code, address and etc. The resulting data storage layer is recoverable. The semiconductor device fabricated by the above method and could be operated in low voltage and at high speed. Further, the semiconductor device fabricated by the above method could be re-programmed after heat treatment. In the following paragraphs, we will discuss these topics respectively.

The method of fabricating a semiconductor device of the present invention includes following steps: (a) providing a first conductor and a second conductor; (b) providing a conductive layer; and (c) forming a part of the conductive layer into a data storage layer by a plasma oxidation process, wherein the data storage layer is positioned between the first and the second conductor. Further, the data storage layer is made of aluminum oxide, cooper oxide, Titanium Oxide, Hafnium Oxide, tungsten oxide, nickel oxide, magnesium oxide or the combination thereof.

A detailed example of the method of fabricating a semiconductor device according to a preferred embodiment of the present invention will be provided. For clarity many details, including steps, materials, and process conditions, will be disclosed. It will be understood that this example is non-limiting, and that these details can be modified, omitted, or augmented while the results fall within the scope of the invention.

Figure 1A:
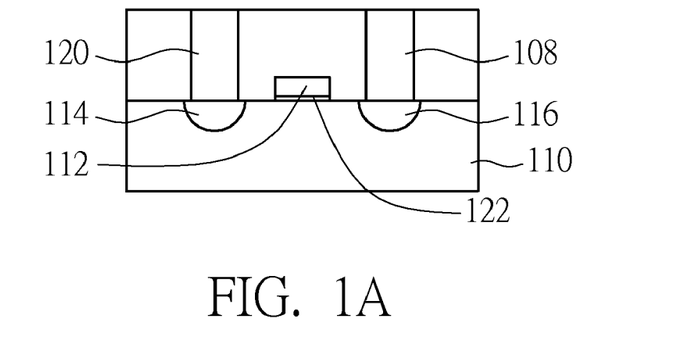
FIG. 1A~1F are cross-sectional view schematically illustrating a method of fabricating a semiconductor device according to the first embodiment of the present invention.

FIG. 1A~1F are cross-sectional view schematically illustrating a method of fabricating a semiconductor device according to the first embodiment of the present invention. The semiconductor device of the present invention is preferably a programmable read-only memory (PROM). The semiconductor device includes a number of memory cells, which are arranged as array. Each memory cell is connected to a line of memory cells by a conductor (i.e. word line, the first conductor), and to a column of memory cells by another conductor (i.e. bit line, the second conductor). For the sake of the simplification and clarification, one memory cell is described and shown in the figure to represent the whole memory device. Firstly, a substrate 110 is provided, and a first conductor 120 is formed over the substrate 110, as shown in FIG. 1A. In the first embodiment, the semiconductor device further includes a transistor as a switch. The transistor preferably includes a gate 112, a gate dielectric layer 122, a source region 114, and a drain region 116. A first conductor 120 is formed over and electrically coupled to the source region 114 of the transistor, and a common electrode 108 is formed on and electrically coupled to the drain region 116.

Figure 1B:
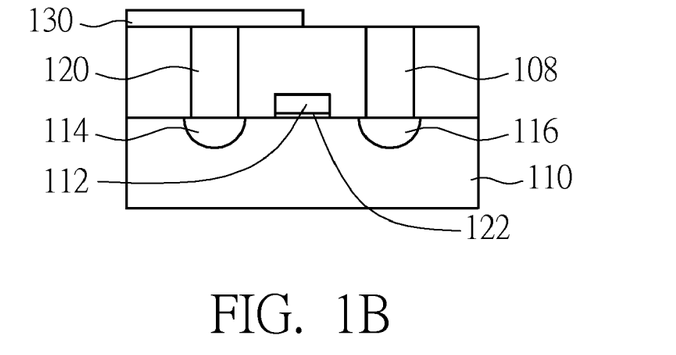
Figure 1C:
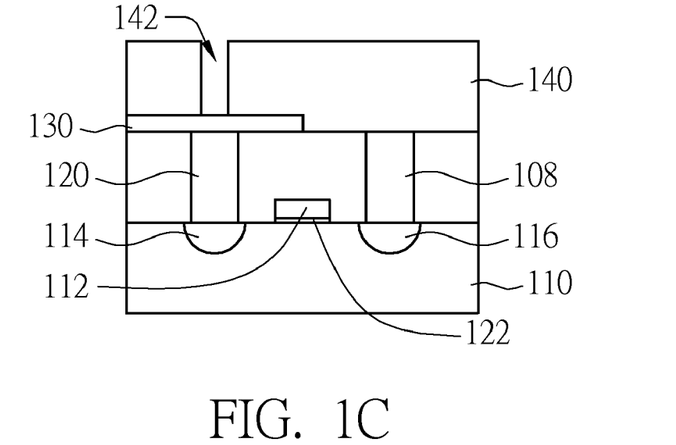
Figure 1D:
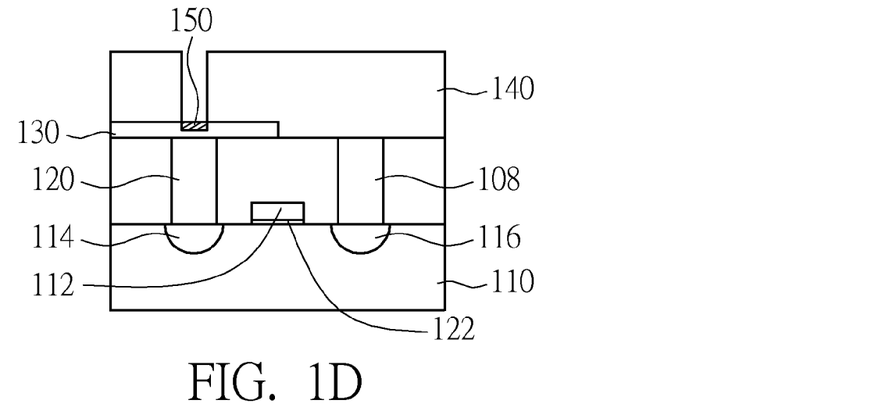

Then, a first conductive layer 130 is formed on the first conductor 120 as shown in FIG. 1B. The first conductive layer 130 is preferably made of aluminum, copper, tungsten, nickel, titanium, hafnium magnesium or the combination thereof. The conductive layer of the first embodiment, for example, is made of aluminum and copper. Then, as shown in FIG. 1C, a patterned dielectric layer 140 is formed on the first conductive layer 130. The patterned dielectric layer 140 has a through hole 142, so that a part of the conductive layer is exposed via the through hole 142. Next, a plasma oxidation process is performed, so that the part of the exposed conductive layer is formed into a data storage layer 150 in the FIG. 1D. For example, the plasma oxidation process is performed in a plasma etch machine, and the operating condition is set as follows: the gas $O_2/N_2$ flow rate is about 4000/200 sccm ($O_2$ could be used ranging from 1000~4000 sccm, $N_2$ could be used ranging from 50~200 sccm); the operating temperature is below 150° C.; and the oxidation time lasts about 10~500 seconds. The operating temperature is preferably below 150° C. such that the memory device would not be damaged during the oxidation process. After the plasma oxidation process, the data storage layer 150 is preferably made of aluminum oxide, cooper oxide, tungsten oxide, nickel oxide, titanium oxide, hafnium oxide, magnesium oxide or the combination thereof. In this embodiment, the data storage layer 150 includes aluminum oxide and cooper oxide since the conductive layer is made of aluminum and cooper. Referring to FIG. 1D, the data storage layer 150 is electrically coupled to the source 114 because of couple of the first conductor 120. The characteristics of the data storage layer 150 fabricated by the above method would be described later.

Figure 1E:
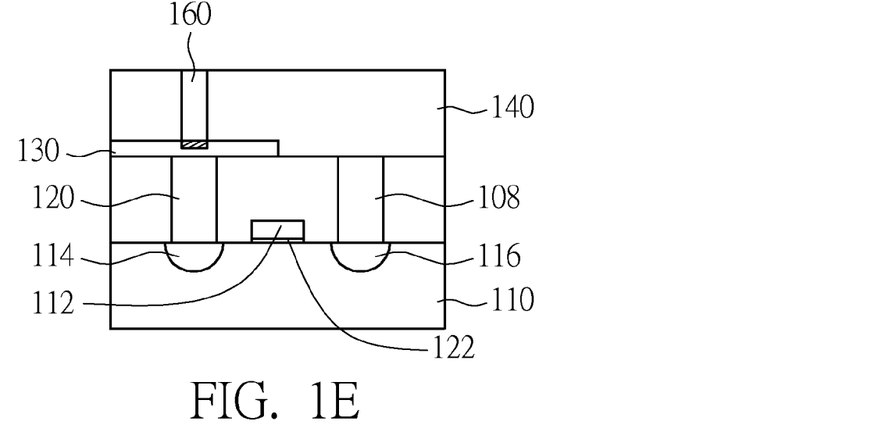
Figure 1F:
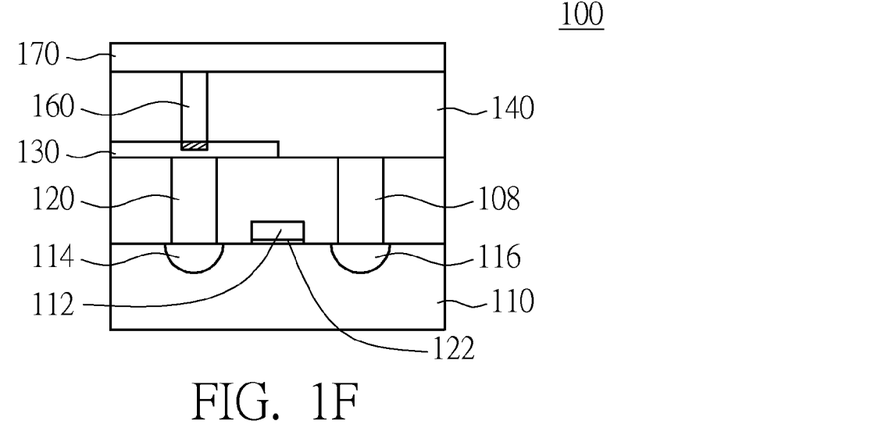

Afterwards, the through hole 142 is filled with a second conductive layer 160, as shown in FIG. 1E. The second conductive layer 160 is preferably made of aluminum, copper, tungsten, nickel, titanium, hafnium magnesium or the combination thereof. The second conductive layer 160 is positioned on the data storage layer 150 for electrically coupling the data storage layer 150 and a second conductor (see 170 of FIG. 1F). Finally, a second conductor 170 is preferably formed on the dielectric layer 140 and the second conductive layer 160, as shown in FIG. 1F. A semiconductor device 100 is completed. A data element, consisting of the data storage layer 150 and preferably the transistor, is also completed. The method of fabricating the data element is disclosed as above since the data element being a part of the semiconductor device.

Figure 2A:
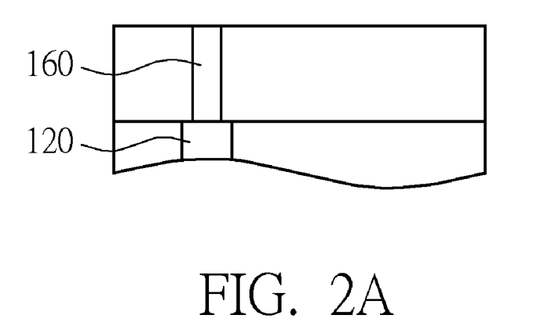
FIG. 2A~2C are cross-sectional view schematically illustrating a method of fabricating a semiconductor device according to the second embodiment.
Figure 2B:
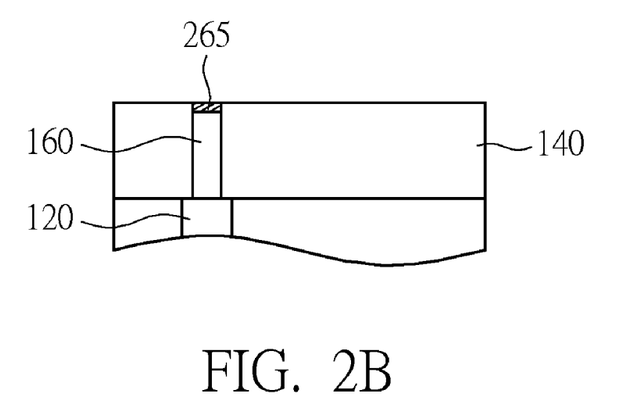
Figure 2C:
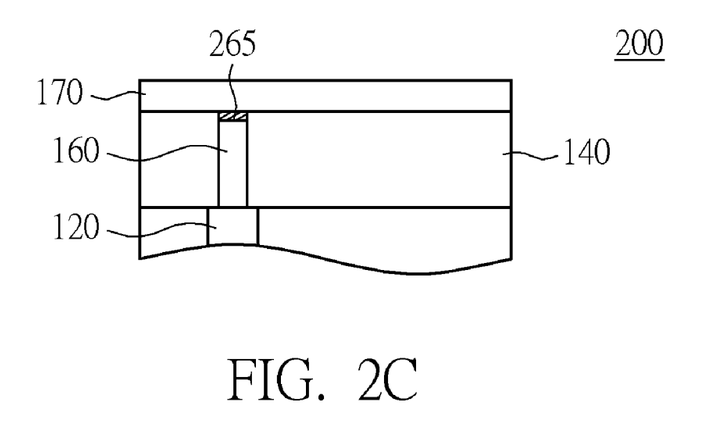

On the other hand, the data storage layer could be electrically coupled to a diode instead of a transistor. FIG. 2A~2C are cross-sectional view schematically illustrating a method of fabricating a semiconductor device according to the second embodiment. The second embodiment is different from the above embodiment by the position of the data storage layer and, inherently, the formation order. The rest of elements are similar, so that they are omitted in the drawings or labeled as the same number. Referring to FIG. 2A, the patterned dielectric layer 140 is formed over the first conductor 120, and the conductive layer 160 fills in the through hole of the patterned dielectric layer 140. The conductive layer 160 is preferably made of aluminum, copper, tungsten, nickel, titanium, hafnium magnesium or the combination thereof. Then, as shown in the FIG. 2B, the conductive layer 160 is oxidized by a plasma oxidation process, and a data storage layer 265 is formed. The data storage layer is made of aluminum oxide, cooper oxide, tungsten oxide, nickel oxide, titanium oxide, hafnium oxide, magnesium oxide or the combination thereof. Finally, a second conductor 170 is formed on the dielectric layer 140 and the data storage layer 265, as shown in FIG. 2C. The data storage layer 265 is therefore interposed between the second conductor 170 and the conductive layer 160. The semiconductor device 200 of the second embodiment, whose data storage layer 265 is made of similar material and formed by similar process, has similar characteristics to that of the first embodiment.

Referring to both FIG. 1F and FIG. 2C, the structure of the semiconductor device 100/200 fabricated by the above method at least includes a data storage layer 150/265 formed by a plasma oxidation process. In the aforementioned embodiments, the semiconductor device 100/200 further includes a first conductor 120, a dielectric layer 140, a conductive layer 160 and a second conductor 170. The patterned dielectric layer 140 has a through hole 142, and is disposed on the first conductor 120. The conductive layer 160 fills in the through hole 142. The second conductor 170 is formed over the conductive layer 160 and the patterned dielectric layer 140. It is worthy to note that the data storage layer 150/265 is positioned between the conductive layer 160 and one of the second conductor 170 and the first conductor 120. In the first embodiment, the data storage layer 150 is positioned between the first conductor 120 and the conductive layer 160, as shown in FIG. 1F. In the second embodiment, the data storage layer 265 is positioned between the second conductor 170 and the conductive layer 160, as shown in FIG. 2C. The data storage layers of the first and second embodiments are fabricated by the similar method, and inherently have similar effects on programming.

One skilled in the art recognized that the connection between the two conductors and the data storage layer could be embodied in various ways and would be not limited in the above description. Related semiconductor devices, including other feasible embodiments and methods of fabrication, are taught in Lung et al., U.S. Pub. No. 2006/0284158, "Self-aligned, Embedded Phase Change RAM And Manufacturing Method", filed Jun. 16, 2006.

Here are some experimental results to demonstrate the characteristics of the semiconductor device fabricated by above method, and the semiconductor device 100 of the first embodiment is provided as the sample for the following tests, at least including a density test, a program test, and a re-program test. The data storage layer made by the plasma oxidation process has low density.

The semiconductor device 100 of the first embodiment can be programmed by low voltage and at high speed. The data storage layer is programmed by applying voltage between the first and second conductors. If the data storage layer is thinner, it is easier to be programmed; that is, it consumes less power or/and takes less time. The thickness of the data storage layer depends on time of the plasma oxidation process. For example, the memory cell of the first embodiment, whose data storage layer is formed by the plasma oxidation process for 50 seconds, can be programmed at 6V within 30 nanoseconds. On the contrary, a conventional read-only memory cell, whose data storage layer is made of silicon oxide and formed by the thermal oxidation, is programmed at 10V within the 2,000 nanoseconds. Evidently, the voltage applied to program the semiconductor device of the present embodiment is greatly reduced by about 60 percentages, as a result of lower power consumption. Besides that, the pulse width taken to program the semiconductor device of the present embodiment is reduced by 1.5 percentages, so that the semiconductor device of the present embodiment can be programmed faster.

Figure 3:
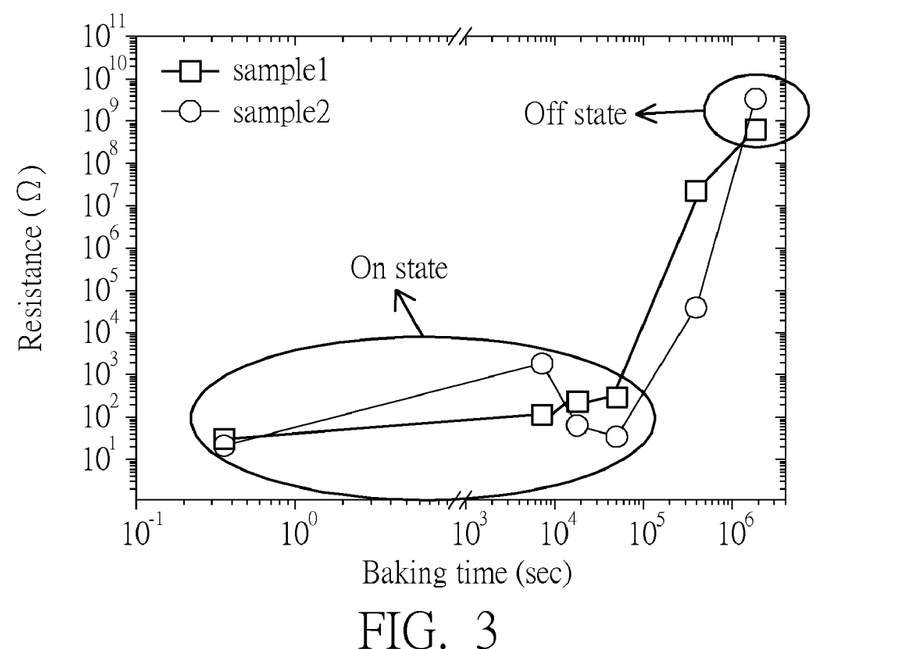
FIG. 3 shows the relation of the baking time and the resistance of the semiconductor device of the first embodiment.
Figure 4:
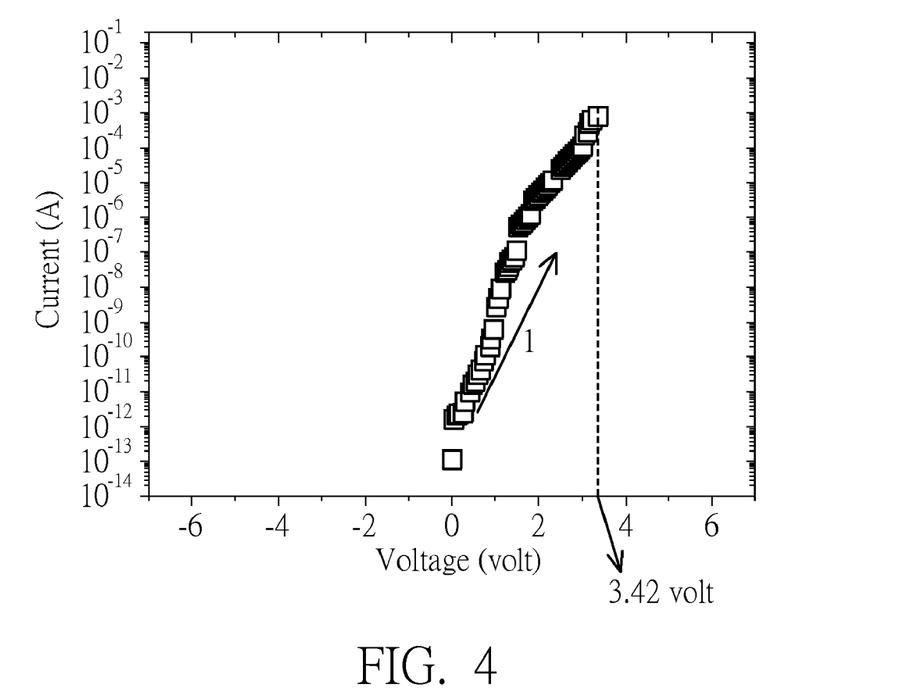
FIG. 4 shows the relation of the driving voltage and the current of the semiconductor device of the first embodiment after heat treatment.

Further, the semiconductor device 100 fabricated by the above method could be re-programmed after heat treatment. Referring to FIG. 3, it shows the relation of the baking time and the resistance of the semiconductor device of the first embodiment. When the semiconductor device 100 of low resistance (i.e. on-state) is baking at 250° C. for 500 hours, it will be converted into one of high resistance (i.e. off-state). That is, the conversion from high resistance to low resistance of the semiconductor device is performed by an annealing process. It is noted that the data storage layer is not damaged during the annealing process, and it can be programmed again; that is, the semiconductor device of high resistance is also convertible into one of low resistance. Referring to FIG. 4, it shows the relation of the driving voltage and the current of the semiconductor device of the first embodiment after heat treatment. The current detected in the semiconductor device responded to the driving voltage represents the resistance of the data storage layer. As shown in FIG. 4, the current is drastically increased from $10^{-12}$ A to $10^{-3}$ A while applying less than 4 voltages; that is, the semiconductor device of high resistance is converted back to one of low resistance. It demonstrates that the semiconductor device could be re-programmed after heat treatment, and the operating condition of re-programming the semiconductor device is similar to those for the first time.

Since the semiconductor device can be re-programmed by annealing process, a method of operating a semiconductor device is provided. The method of operating a semiconductor device, which comprising a plurality of memory cells and each of the memory cells comprising a data storage layer, at least comprising (a) providing a semiconductor device comprising a data storage layer in unprogrammed state and a switch electrically connected thereto; (b) applying a bias to the data storage layer so as to allow the data storage layer to be in a programmed state; (c) heating the data storage layer in programmed state for converting into the unprogrammed state; and (d) applying the bias to the data storage layer so as to allow the data storage layer to return in a programmed state. The data storage layer in programmed state is preferably baked for up to 250° C. for at least 400 hours, and it results in conversion of programmed state into the unprogrammed state.

Figure 5A:
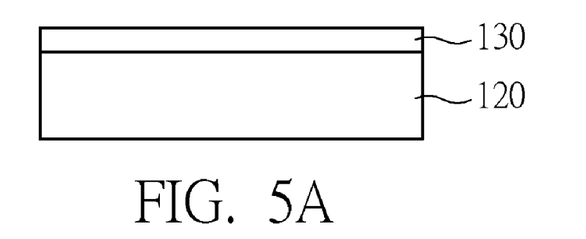
FIG. 5A~5E are cross-sectional view schematically illustrating a method of fabricating a semiconductor device according to the third embodiment of the present invention.
Figure 5B:
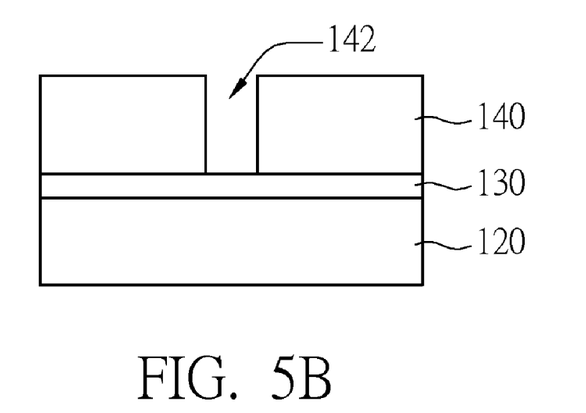
Figure 5C:
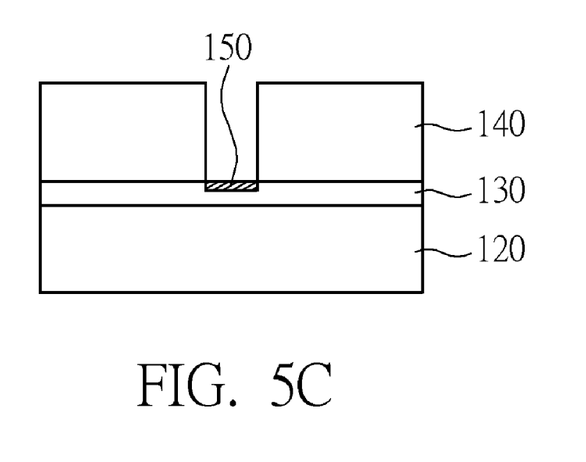
Figure 5D:
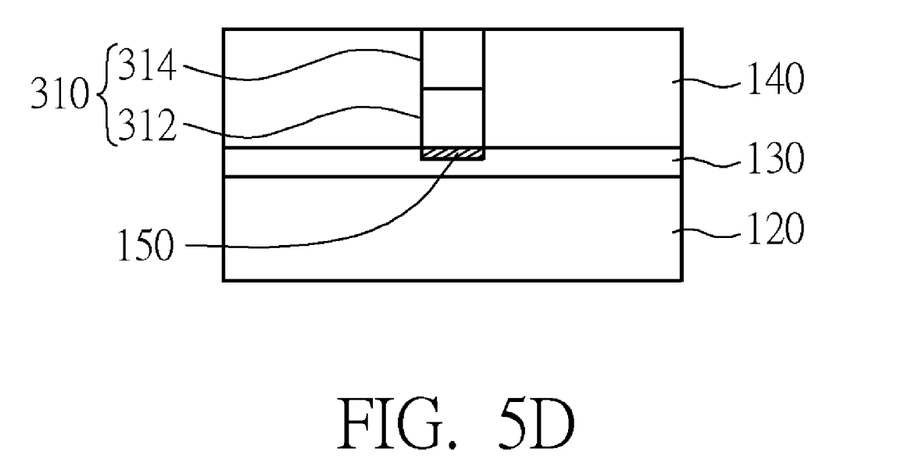
Figure 5E:
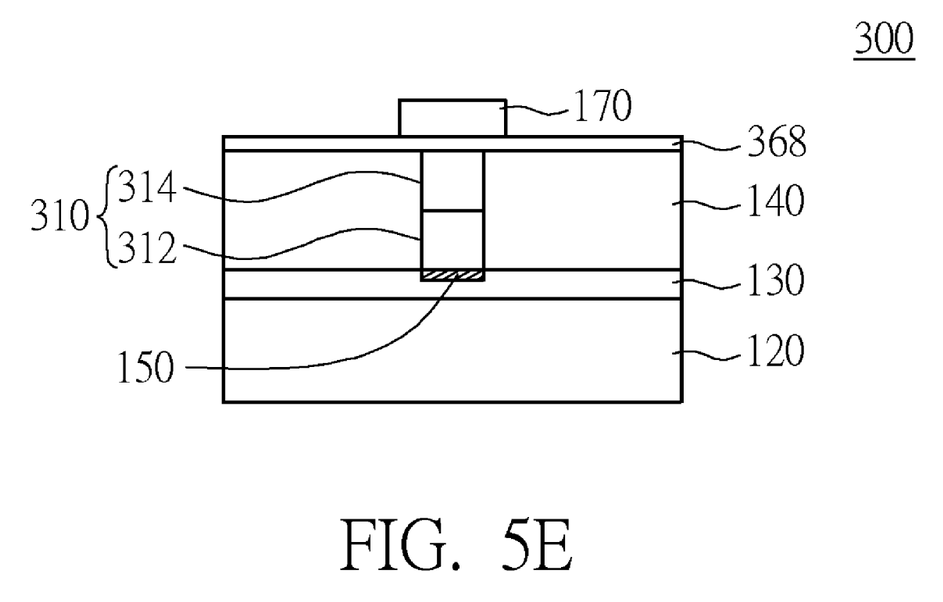

FIG. 5A~5E are cross-sectional view schematically illustrating a method of fabricating a semiconductor device according to the third embodiment of the present invention. The rest of elements are similar and remain the same numbers. Firstly, a first conductor 120 is provided, and a conductive layer 130 is formed over the first conductor 120 as shown in FIG. 5A. Then, as shown in FIG. 5B, a patterned dielectric layer 140 is formed on the conductive layer 130. The patterned dielectric layer 140 has a through hole 142, so that a part of the conductive layer is exposed via the through hole 142. Next, a plasma oxidation process is performed, so that the part of the exposed conductive layer is converted into a data storage layer 150 in the FIG. 5C. Finally, a diode, is preferably formed over the data storage layer, so that the diode is electrically coupled to the data storage layer. Referring to FIG. 5D, a diode 310 is a p-n junction diode, which includes an n-type dielectric layer 312, such as n-type silicon oxide formed on the data storage layer 150 and a p-type dielectric layer 314, such as p-type silicon oxide formed on the n-type dielectric layer 312. Afterwards, a second conductor 170 is preferably formed over the dielectric layer 140 and the diode 310, as shown in FIG. 5E. A barrier layer 368 is, more preferably, formed between the second conductor 170 and the diode 310 to prevent impurity from diffusing into the second conductor 170. A semiconductor device 300 according to the third embodiment of the present invention is completed.

According to the present invention, another structure of the semiconductor device is provided. The structure of the semiconductor device 300 of the third embodiment at least includes a data storage layer 150 formed by a plasma oxidation process and a diode 310 electrically connected to the data storage layer 150. In the third embodiment, the semiconductor device 300 further includes a first conductor 120, a dielectric layer 140 and a second conductor 170. The dielectric layer 140 having a through hole 142 is disposed on the first conductor 120. The diode 310 is positioned in the through hole 142. The data storage layer 150 is positioned between the first conductor 120 and the diode 310. The second conductor 170 is disposed on the dielectric layer 140 and the diode 310. A barrier layer 368 is, more preferably, formed between the second conductor 170 and the diode 310 to prevent impurity from diffusing into the second conductor 170.

The semiconductor device of the third embodiment owns similar advantages to those of the first and second embodiments, since the data storage layer is fabricated by similar method. Besides that, the process of fabricating a diode is much simpler that that of a transistor, so that the size of one memory cell of the third embodiment can be reduced, even below $3F^2$. It therefore results in a high-density and small-sized semiconductor device.

As described hereinbefore, the semiconductor device, the data element thereof and the method of fabricating the same, whose data storage layer is formed by a plasma oxidation process, has at least following listed advantages.

1. The semiconductor device can be programmed by low voltage and at high speed. According to the exampled described above, the voltage applied to program the semiconductor device of the present embodiment is reduced to about 60 percentages, and the pulse width taken to program the semiconductor device of the present embodiment is greatly reduced to 1.5 percentages.

2. The semiconductor device of the present embodiments is capable of being re-programmed after heat treatment.

What is claimed is:

1. A method of fabricating a semiconductor device, comprising:
providing a first and a second conductor;
providing a conductive layer; and
forming a part of the conductive layer into a data storage layer by a plasma oxidation process, wherein the data storage layer is positioned between the first and the second conductor.

2. The method according to claim 1, wherein the conductive layer is made of copper, tungsten, nickel, Titanium, Hafnium, magnesium or the combination thereof.

3. The method according to claim 1 further comprising:
forming a diode over the data storage layer.

4. The method according to claim 1 further comprising:
providing a transistor electrically coupled to the data storage layer.

5. The method according to claim 1, further comprising:
forming a patterned dielectric layer over the conductive layer so as to expose the part of the conductive layer; and
oxidizing the exposed conductive layer so as to form the data storage layer over the first conductor.

6. The method according to claim 1, further comprising:
forming a dielectric layer over the first conductor;
patterning the dielectric layer so as to form a through hole thereof;
filling the through hole with the conductive layer; and
oxidizing the conductive layer so as to form the data storage layer, wherein the second conductor is positioned over the dielectric layer and the data storage layer, and the data storage layer is interposed between the second conductor and the conductive layer.

7. The method according to claim 1, wherein the semiconductor device is a programmable read-only memory (PROM).

8. The method according to claim 7, wherein the conductive layer is made of aluminum and the data storage layer is made of aluminum oxide.

9. A method of fabricating a data element, comprising:
providing a conductive layer; and
oxidizing a part of the conductive layer into a data storage layer by a plasma process.

10. The method according to claim 9, wherein the conductive layer is made of at least one selected from the group consisting of copper, tungsten, nickel, titanium, hafnium, magnesium and the combination thereof.

11. The method according to claim 9 further comprising:
forming a diode over the data storage layer.

12. The method according to claim 9 further comprising:
providing a transistor electrically coupled to the data storage layer.

13. The method according to claim 9 further comprising:
forming a patterned dielectric layer over the conductive layer so as to expose the part of the conductive layer; and
oxidizing the exposed conductive layer so as to form the data storage layer.

14. The method according to claim 9 further comprising:
providing a first conductor;
forming a dielectric layer on the first conductor;
patterning the dielectric layer so as to form a through hole thereof;
filling the through hole with the conductive layer;
oxidizing the conductive layer so as to form the data storage layer; and
providing a second conductor on the dielectric layer and the data storage layer, wherein the data storage layer is interposed between the second conductor and the conductive layer.

15. The method according to claim 9, wherein the data element is a programmable read-only memory (PROM).

16. The method according to claim 15, wherein the conductive layer is made of aluminum and the data storage layer is made of aluminum oxide.

17. A semiconductor device comprising:
a first and a second conductors;
a patterned dielectric layer having a through hole, disposed on the first conductor;
a conductive layer filling in the through hole, wherein the second conductor is formed over the conductive layer and the patterned dielectric layer;
a data storage layer formed by a plasma oxidation process;
wherein the data storage layer is positioned between the conductive layer and one of the first conductor and the second conductor.

18. A semiconductor device comprising:
a first and a second conductors;
a data storage layer formed by a plasma oxidation process;
a dielectric layer having a through hole, the dielectric layer disposed between the first conductor and the second conductor; and
a diode positioned in the through hole;
wherein the data storage layer is positioned between the first and the second conductors and is positioned between the first conductor and the diode.

19. The semiconductor device according to claim 17, wherein the data storage layer is made of cooper oxide, tungsten oxide, nickel oxide, Titanium oxide, Hafnium oxide, magnesium or the combination thereof.

20. The semiconductor device according to claim 17, further comprising:
a transistor, disposed under the first conductor.

21. The semiconductor device according to claim 17, wherein a diode is positioned in the through hole, the data storage layer is positioned between the first conductor and the diode.

22. The semiconductor device according to claim 17, wherein a diode is electrically coupled to the data storage layer.

23. The semiconductor device according to claim 17, wherein the data storage layer is recoverable.

24. The semiconductor device according to claim 17, wherein the semiconductor device is a programmable read-only memory (PROM).

25. The semiconductor device according to claim 17, wherein the data storage layer is made of aluminum oxide.

* * * * *